(12) United States Patent
Seo et al.

(10) Patent No.: US 11,737,347 B2
(45) Date of Patent: Aug. 22, 2023

(54) THIN FILM, METHOD OF MANUFACTURING THIN FILM, AND LIGHT-EMITTING DEVICE INCLUDING THIN FILM

(71) Applicant: Samsung Electronics Co., Ltd., Suwon-si (KR)

(72) Inventors: Byunghwa Seo, Seongnam-si (KR); YongChurl Kim, Seoul (KR); Hyungjun Kim, Suwon-si (KR); Yong Joo Lee, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 220 days.

(21) Appl. No.: 17/034,054

(22) Filed: Sep. 28, 2020

(65) Prior Publication Data

US 2021/0284811 A1    Sep. 16, 2021

(30) Foreign Application Priority Data

Mar. 12, 2020    (KR) .................. 10-2020-0030756

(51) Int. Cl.
*H10K 85/10*     (2023.01)
*C09K 11/66*    (2006.01)
*C08L 39/08*    (2006.01)
*C01G 21/00*    (2006.01)
*C08L 25/06*    (2006.01)
(Continued)

(52) U.S. Cl.
CPC .......... *H10K 85/141* (2023.02); *B05D 3/107* (2013.01); *C01G 21/006* (2013.01); *C08L 25/06* (2013.01); *C08L 39/08* (2013.01); *C09D 125/08* (2013.01); *C09D 139/08* (2013.01); *C09K 11/02* (2013.01);
(Continued)

(58) Field of Classification Search
CPC ..... C09K 11/02; C09K 11/025; C09K 11/664; C09K 11/665
See application file for complete search history.

(56) References Cited

U.S. PATENT DOCUMENTS 4,489,185 A * 12/1984 Schoenberg ........... C08G 73/10
528/229
5,077,382 A * 12/1991 Meterko .................. H01L 24/29
528/188

(Continued)

FOREIGN PATENT DOCUMENTS

CN          109698281 A    4/2019
JP        2018504787 A    2/2018
(Continued)

*Primary Examiner* — C Melissa Koslow
(74) *Attorney, Agent, or Firm* — Cantor Colburn LLP

(57) ABSTRACT

A thin film includes a luminescent compound represented by Formula 1 and a random copolymer, wherein the random copolymer includes a first repeating unit including at least one aromatic ring, and a second repeating unit including a heteroatom including at least one lone pair of electrons, $$[A]_n[Q]_m[X]_l \qquad \text{Formula 1}$$

wherein, in Formula 1,
A is a monovalent organic cation, a monovalent inorganic cation, or a combination thereof,
Q is a divalent metal cation, a divalent metalloid cation, or a combination thereof,
X is at least one monovalent halogen ion,
n is an integer from 1 to 3,
m is an integer from 1 to 2, and
l is an integer from 1 to 5.

18 Claims, 6 Drawing Sheets

(51) Int. Cl.
  *B05D 3/10* (2006.01)
  *C09K 11/02* (2006.01)
  *C09D 125/08* (2006.01)
  *C09D 139/08* (2006.01)
  *H10K 50/11* (2023.01)

(52) U.S. Cl.
  CPC .......... *C09K 11/664* (2013.01); *C09K 11/665* (2013.01); *H10K 50/11* (2023.02)

(56) References Cited

U.S. PATENT DOCUMENTS

2008/0202583 A1  8/2008  Lee
2017/0324057 A1* 11/2017 Friend .................. H01L 51/502
2020/0227667 A1  7/2020  Friend et al.

FOREIGN PATENT DOCUMENTS

JP  2019-108410   *  7/2020
KR  1020080079894 A   9/2008
KR  101945128 B1   2/2019

* cited by examiner

THIN FILM, METHOD OF MANUFACTURING THIN FILM, AND LIGHT-EMITTING DEVICE INCLUDING THIN FILM

CROSS-REFERENCE TO RELATED APPLICATION

This application claims priority to and the benefit of Korean Patent Application No. 10-2020-0030756, filed on Mar. 12, 2020, in the Korean Intellectual Property Office, and all the benefits accruing therefrom under 35 U.S.C. § 119, the content of which is incorporated herein in its entirety by reference.

BACKGROUND

1. Field

The present disclosure relates to a thin film, a method of manufacturing the thin film, and a light-emitting device including the thin film.

2. Description of Related Art

Light-emitting devices are devices that convert electrical energy into light energy.

Commercially available light-emitting devices include an anode, a cathode, and an emission layer between the anode and the cathode. Additionally, a hole transport region may be between the anode and the emission layer, and an electron transport region may be between the emission layer and the cathode. Holes provided from the anode may move toward the emission layer through the hole transport region, and electrons provided from the cathode may move toward the emission layer through the electron transport region. The holes and the electrons recombine in the emission layer to produce excitons. These excitons transit from an excited state to a ground state to thereby generate light.

SUMMARY

Provided are a thin film, a light-emitting device including the thin film, and a method of manufacturing the thin film.

Additional aspects will be set forth in part in the description which follows and, in part, will be apparent from the description, or may be learned by practice of the presented embodiments of the disclosure.

According to an aspect, a thin film includes a luminescent compound represented by Formula 1 and a random copolymer,
wherein the random copolymer includes
a first repeating unit including at least one aromatic ring, and
a second repeating unit including a heteroatom including at least one lone pair of electrons,

  Formula 1 wherein, in Formula 1,
A is a monovalent organic cation, a monovalent inorganic cation, or a combination thereof,
Q is a divalent metal cation, a divalent metalloid cation, or a combination thereof,
X is at least one monovalent halogen ion,
n is an integer from 1 to 3,
m is an integer from 1 to 2, and
l is an integer from 1 to 5.

According to an embodiment, the thin film may consist essentially of the luminescent compound and the random copolymer.

According to an embodiment, the thin film may include a first area and a second area, wherein a ratio of a weight ratio of the luminescent compound to the random copolymer in the first area to a weight ratio of the luminescent compound to the random copolymer in the second area may be in a range of about 0.9:1.0 to about 1.0:0.9.

According to an embodiment, the thin film may include a first surface and a second surface facing the first surface, wherein a ratio of a weight ratio of the luminescent compound to the random copolymer in the first surface to a weight ratio of the luminescent compound to the random copolymer in the second surface may be in a range of about 0.9:1.0 to about 1.0:0.9.

According to an embodiment, a weight of the luminescent compound may be about 50 percent by weight (wt %) to less than 100 wt %, based on the total weight of the thin film.

According to an embodiment, the at least one aromatic ring may consist of carbon atoms and hydrogen atoms.

According to an embodiment, the at least one aromatic ring may include 6 to 30 carbon atoms.

According to an embodiment, the at least one aromatic ring may be a benzene group, a naphthalene group, a phenanthrene group, an anthracene group, a chrysene group, a pyrene group, a triphenylene group, or a combination thereof.

According to an embodiment, the heteroatom may be a nitrogen atom, an oxygen atom, a sulfur atom, or a combination thereof.

According to an embodiment, the second repeating unit may be an ether group, a benzoxazole group, a pyridine group, or a combination thereof.

According to an embodiment, A may be an ammonium ion, an alkylammonium ion, an arylammonium ion, an aryl alkylammonium ion, a formamidinium ion, an alkylamidinium ion, an arylamidinium ion, an aryl alkylamidinium ion, an alkali metal ion, or a combination thereof,
Q may be $Pb^{2+}$, $Sn^{2+}$, $Bi^{2+}$, $Sb^{2+}$, $Cu^{2+}$, $Ag^{2+}$, $Au^{2+}$, $La^{2+}$, $Ce^{2+}$, $Pr^{2+}$, $Nd^{2+}$, $Pm^{2+}$, $Sm^{2+}$, $Eu^{2+}$, $Gd^{2+}$, $Tb^{2+}$, $Dy^{2+}$, $Ho^{2+}$, $Er^{2+}$, $Tm^{2+}$, $Yb^{2+}$, $Lu^{2+}$, $Be^{2+}$, $Mg^{2+}$, $Ca^{2+}$, $Sr^{2+}$, $Ba^{2+}$, $Ra^{2+}$, or a combination thereof, and
X may be $Cl^-$, $Br^-$, $I^-$, or a combination thereof.

According to an embodiment, A may be a methylammonium (MA) ion, a formamidinium (FA) ion, Cs+, or a combination thereof, Q may be $Pb^{2+}$, $Cu^{2+}$, $Ag^{2+}$, $Au^{2+}$, or a combination thereof, and X may be $Br^-$, $I^-$, or a combination thereof.

According to an embodiment, the luminescent compound may be represented by Formula 1-1, Formula 1-2, or a combination thereof:

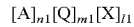  Formula 1-1

  Formula 1-2 wherein, in Formulae 1-1 and 1-2,
A is a monovalent organic cation, a monovalent inorganic cation, or a combination thereof,
Q is a divalent metal cation, a divalent metalloid cation, or a combination thereof,
X is at least one monovalent halogen ion,
n1 may be 1, m1 may be 1, l1 may be 3,
n2 may be 3, m2 may be 2, and l2 may be 5.

According to an embodiment, in Formulae 1-1 and 1-2, A may be a methylammonium (MA) ion, a formamidinium (FA) ion, Cs+, or a combination thereof, Q may be $Pb^{2+}$, $Cu^{2+}$, $Ag^{2+}$, $Au^{2+}$, or a combination thereof, and X may be $Br^-$, $I^-$, or a combination thereof.

According to an embodiment, the luminescent compound may be methylammonium (MA) $PbBr_3$, methylammonium (MA) $PbI_3$, formamidinium (FA) $PbBr_3$, formamidinium (FA) $PbI_3$, $CsPbBr_3$, $CsPbI_3$, trimethylammonium ($MA_3$) $Cu_2Br_5$, trimethylammonium ($MA_3$) $Cu_2I_5$, triformamidinium ($FA_3$) $Cu_2Br_5$, triformamidinium ($FA_3$) $Cu_2I_5$, $Cs_3Cu_2Br_5$, $Cs_3Cu_2I_5$, or a combination thereof.

According to an embodiment, a light-emitting device may include: a first electrode; a second electrode facing the first electrode; and an emission layer between the first electrode and the second electrode, wherein the emission layer may include the thin film.

According to an embodiment, the light-emitting device may include a hole transport region between the first electrode and the emission layer and/or an electron transport region between the emission layer and the second electrode.

According to an embodiment, the light-emitting device may further include a first charge transport layer between the first electrode and the emission layer, and the first charge transport layer may include a hydrophobic material.

According to an embodiment, the first charge transport layer may be in direct contact with the emission layer.

According to an embodiment, a method of manufacturing a thin film may include: providing, on a substrate, a mixture including at least one A-containing precursor, at least one Q-containing precursor, a random copolymer including a first repeating unit including at least one aromatic ring and a second repeating unit including a heteroatom including at least one lone pair of electrons, and a solvent; adding an antisolvent to the mixture to crystallize the mixture; and heat-treating the mixture to remove the solvent and the antisolvent to form the thin film.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
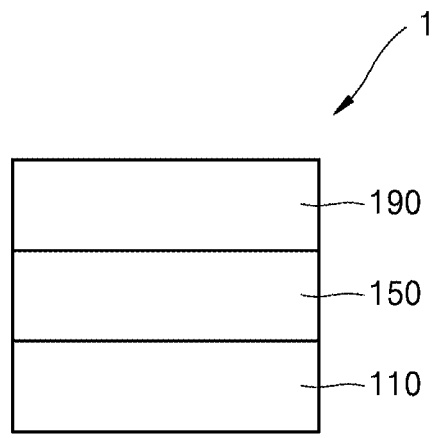
FIG. 1 is a schematic cross-sectional view of a light-emitting device according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

As the inventive concept allows for various changes and numerous embodiments, particular embodiments will be illustrated in the drawings and described in detail in the written description. Effects, features, and a method of achieving the inventive concept will be obvious by referring to example embodiments of the inventive concept with reference to the attached drawings. The inventive concept may, however, be embodied in many different forms and should not be construed as being limited to the embodiments set forth herein.

Most of the terms used herein are general terms that have been widely used in the technical art to which the inventive concept pertains. However, some of the terms used herein may be created reflecting intentions of technicians in this art, precedents, or new technologies. Also, some of the terms used herein may be arbitrarily chosen by the present applicant. In this case, these terms are defined in detail below. Accordingly, the specific terms used herein should be understood based on the unique meanings thereof and the whole context of the inventive concept.

In the present specification, when a part "includes" a component, it means that other components may be further included unless otherwise specified.

The same reference numerals in the drawings refer to the same components, and the size of each component in the drawings may be exaggerated or reduced for clarity and convenience of description.

When a part such as a layer, film, area, plate, or the like is described to be "on" another part, this description is construed as including not only the case where the part is "directly on" the other part but also the case where another part is interposed therebetween. On the other hand, when a part is described to be "directly on" another part, this description is construed as that no other part is interposed therebetween.

In the present specification, the singular form also includes the plural form unless otherwise specified.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±10% or 5% or 1% of the stated value.

In the present specification, the term "Group" refers to a group on the International Union of Pure and Applied Chemistry (IUPAC) Periodic Table of Elements.

In the present specification, the term "alkyl" is construed as including a straight, branched chain, or cyclic saturated aliphatic hydrocarbon having 1 to 12 carbon atoms, or 1 to 6 carbon atoms, or 1 to 3 carbon atoms.

In the present specification, the term "aryl" is construed as including means a cyclic moiety in which all ring members are carbon and at least one ring is aromatic, the moiety having 6 to 24 carbon atoms, or 6 to 12 carbon atoms. More than one ring may be present, and any additional rings may be independently aromatic, saturated, or partially unsaturated, and may be fused, pendant, spirocyclic or a combination thereof.

In the present specification, the term "arylalkyl" means an aryl group covalently linked to an alkyl group that is linked to another atom (e.g., a benzyl is a C7 arylalkyl group).

In the present specification, the term "metal" is construed as including an alkali metal, an alkaline earth metal, a transition metal, a post-transition metal, a lanthanide group metal, and an actinide group metal.

In the present specification, the term "metalloid" is construed as including boron (B), silicon (Si), germanium (Ge), arsenic (As), antimony (Sb), and tellurium (Te).

In the present specification, the term "halogen" refers to a Group 17 element.

In the present specification, the term "maximum emission wavelength" refers to a wavelength value of a point having a maximum emission intensity in a photoluminescence (PL) spectrum obtained for a sample after preparing a solution or film sample including a compound.

In the present specification, "full width at half maximum (FWHM)" refers to a wavelength width of a point corresponding to ½ of the maximum emission intensity in the aforementioned PL spectrum.

Hereinafter, a thin film, a method of manufacturing the thin film, and a light-emitting device including the thin film will be described in detail with reference to the accompanied drawings.

Thin Film

According to an embodiment, a thin film may include a luminescent compound represented by Formula 1 and a random copolymer:

$$[A]_n[Q]_m[X]_l \quad \text{Formula 1}$$

wherein, in Formula 1,

A may be a monovalent organic cation, a monovalent inorganic cation, or a combination thereof, Q may be a divalent metal cation, a divalent metalloid cation, or a combination thereof, X may be at least one monovalent halogen ion, n may be an integer from 1 to 3, m may be an integer from 1 to 2, and l may be an integer from 1 to 5.

The random copolymer may include a first repeating unit including at least one aromatic ring and a second repeating unit including a heteroatom including at least one lone pair of electrons.

According to an embodiment, the thin film may consist essentially of the luminescent compound and the random copolymer. According to an embodiment, the thin film may consist of the luminescent compound and the random copolymer.

When the thin film includes a random copolymer, the film may not form a predetermined structure, for example, unlike a thin film including a block copolymer. Accordingly, when a plurality of random areas are selected in the thin film, content ratios of the luminescent compound to the random copolymer in the plurality of random areas may be substantially identical to one another.

According to an embodiment, the thin film may include a first area and a second area, wherein a ratio of a weight ratio of the luminescent compound to the random copolymer in the first area to a weight ratio of the luminescent compound to the random copolymer in the second area may be in a range of about 0.9:1.0 to about 1.0:0.9.

In an embodiment, a weight ratio of the luminescent compound to the random copolymer in the first area may be identical to a weight ratio of the luminescent compound to the random copolymer in the second area.

According to an embodiment, the thin film may include a first surface and a second surface facing the one surface, wherein a ratio of a weight ratio of the luminescent compound to the random copolymer in the first surface to a weight ratio of the luminescent compound to the random copolymer in the second surface may be in a range of about 0.9:1.0 to about 1.0:0.9.

In an embodiment, a weight ratio of the luminescent compound to the random copolymer in the first surface may be identical to a weight ratio of the luminescent compound to the random copolymer in the second surface.

According to an embodiment, a weight of the luminescent compound may be 50 percent by weight (wt %) or greater, e.g. about 50 wt % to less than 100 wt %, based on the total weight of the thin film. According to an embodiment, a weight of the luminescent compound may be 80 wt % or greater, based on the total weight of the thin film. When the weight of the luminescent compound is within these ranges, the luminescent compound may exhibit a suitable level of luminescence efficiency for use in an emission layer of a light-emitting device.

Hereinafter, the random copolymer will be described in detail.

The first repeating unit included in the random copolymer may have π-π interaction. Thus, a polycrystalline thin film with high thin film stability may be provided even onto a hydrophobic surface.

In addition, the second repeating unit included in the random copolymer includes a lone pair of electrons. Thus, the second repeating unit may provide a coordinate bond with a metal atom or the like included in the luminescent compound, thereby improving the efficiency of the luminescent compound.

According to an embodiment, the at least one aromatic ring included in the first repeating unit may consist of carbon atoms and hydrogen atoms. That is, the at least one aromatic ring may not include a heteroatom such as a nitrogen atom.

In an embodiment, the at least one aromatic ring may include 6 to 30 carbon atoms.

In an embodiment, the at least one aromatic ring may be a benzene group, a naphthalene group, a phenanthrene group, an anthracene group, a chrysene group, a pyrene group, a triphenylene group, or a combination thereof.

In an embodiment, the first repeating unit may be represented by the following structures:

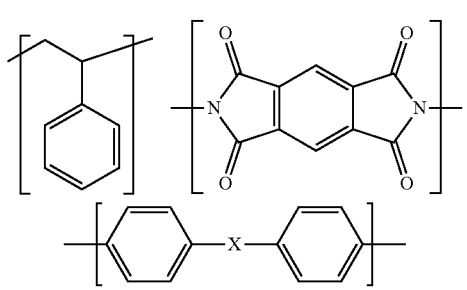

wherein, in these formulae, X may be oxygen, sulfur, or a substituted or unsubstituted methylene group.

In an embodiment, the heteroatom included in the second repeating unit may be a nitrogen atom, an oxygen atom, a sulfur atom, or a combination thereof.

In an embodiment, the second repeating unit may include an ether group, a benzoxazole group, a pyridine group, or a combination thereof.

In an embodiment, the second repeating unit may be represented by the following structures:

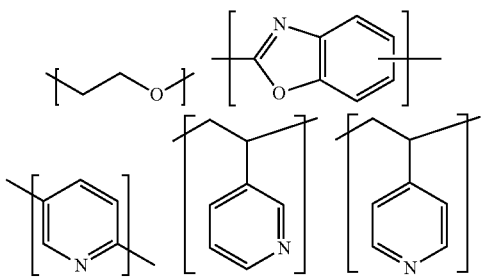

A weight average molecular weight of the random copolymer may be in a range of about 50,000 to about 300,000, and a number average molecular weight of the random copolymer may be in a range of about 40,000 to about 200,000. When the weight average molecular weight and the number average molecular weight are each within these ranges, a polycrystalline thin film with high thin film stability may be provided even onto a hydrophobic surface.

Hereinafter, the luminescent compound will be described in detail.

In an embodiment, in Formula 1, A may be an ammonium ion, an alkylammonium ion, an arylammonium ion, an arylalkylammonium ion, a formamidinium ion, an alkylamidinium ion, an arylamidinium ion, an aryl alkylamidinium ion, an alkali metal ion, or a combination thereof.

In an embodiment, in Formula 1, A may be a methylammonium (MA) ion, a formamidinium (FA) ion, Cs+, or a combination thereof, In an embodiment, in Formula 1, Q may be $Pb^{2+}$, $Sn^{2+}$, $Bi^{2+}$, $Sb^{2+}$, $Cu^{2+}$, $Ag^{2+}$, $Au^{2+}$, $La^{2+}$, $Ce^{2+}$, $Pr^{2+}$, $Nd^{2+}$, $Pm^{2+}$, $Sm^{2+}$, $Eu^{2+}$, $Gd^{2+}$, $Tb^{2+}$, $Dy^{2+}$, $Ho^{2+}$, $Er^{2+}$, $Tm^{2+}$, $Yb^{2+}$, $Lu^{2+}$, $Be^{2+}$, $Mg^{2+}$, $Ca^{2+}$, $Sr^{2+}$, $Ba^{2+}$, $Ra^{2+}$, or a combination thereof.

In an embodiment, in Formula 1, Q may be $Pb^{2+}$, $Cu^{2+}$, $Ag^{2+}$, $Au^{2+}$, or a combination thereof.

In an embodiment, in Formula 1, X may be $Cl^-$, $Br^-$, $I^-$, or a combination thereof.

In an embodiment, in Formula 1, X may be $Br^-$, $I^-$, or a combination thereof.

In Formula 1, n, m, and l may each be a suitable integer such that the luminescent compound represented by Formula 1 may be neutral (without a positive or negative charge).

In an embodiment, the luminescent compound may be represented by Formula 1-1, Formula 1-2, or a combination thereof:

$[A]_{n1}[Q]_{m1}[X]_{l1}$      Formula 1-1

$[A]_{n2}[Q]_{m2}[X]_{l2}$      Formula 1-2 wherein, in Formulae 1-1 and 1-2,

A, Q, and X may respectively be understood by referring to the descriptions of

A, Q, and X of Formula 1, n1 may be 1, m1 may be 1, l1 may be 3, n2 may be 3, m2 may be 2, and l2 may be 5.

In an embodiment, in Formulae 1-1 and 1-2, A may be a methylammonium (MA) ion, a formamidinium (FA) ion, Cs+, or a combination thereof, Q may be $Pb^{2+}$, $Cu^{2+}$, $Ag^{2+}$, $Au^{2+}$, or a combination thereof, and X may be $Br^-$, $I^-$, or a combination thereof.

In an embodiment, the luminescent compound may be selected from $MAPbBr_3$, $MAPbI_3$, $FAPbBr_3$, $FAPbI_3$, $CsPbBr_3$, $CsPbI_3$, $MA_3Cu_2Br_5$, $MA_3Cu_2I_5$, $FA_3Cu_2Br_5$, $FA_3Cu_2I_5$, $Cs_3Cu_2Br_5$, and $Cs_3Cu_2I_5$.

The luminescent compound may emit red light, green light, or blue light.

A maximum emission wavelength of the luminescent compound (experimental value) may be about 420 nanometers (nm) or longer and about 550 nm or shorter.

A full width at half maximum (FWHM) of the luminescent compound may be 100 nm or shorter. In an embodiment, a FWHM of the luminescent compound may be 90 nm or shorter, 85 nm or shorter, 80 nm or shorter, 75 nm or shorter, 70 nm or shorter, 50 nm or shorter, 30 nm or shorter, or 20 nm or shorter.

A method of synthesizing the thin film represented by Formula 1 may be apparent to one of ordinary skill in the art by referring to the manufacturing method and Synthesis Examples provided herein.

Method of Manufacturing Thin Film

In an embodiment, a method of manufacturing the thin film represented by Formula 1 may include: providing, on a substrate, a mixture including at least one A-containing precursors, at least one Q-containing precursors, a random copolymer including a first repeating unit including at least one aromatic ring and a second repeating unit including a heteroatom including at least one lone pair of electrons, and a solvent; adding an antisolvent to the mixture to crystallize the mixture; and heat-treating the mixture to remove the solvent and the antisolvent to form a thin film.

First, a mixture may be provided on a substrate, the mixture including at least one selected from A-containing precursors, at least one selected from Q-containing precursors, a random copolymer including a first repeating unit including at least one aromatic ring and a second repeating unit having a heteroatom including at least one lone pair electron, and a solvent.

In the mixture, a molar ratio of at least one selected from the A-containing precursor, and a molar ratio of at least one selected from the Q-containing precursor may each be determined according to the composition of the final luminescent compound represented by Formula 1.

In an embodiment, an atomic ratio of A to an atomic ratio of Q in the final luminescent compound represented by Formula 1 may be 3:2 or 1:1. Accordingly, the composition of the mixture may be determined within this range.

In the mixture, a content of the random copolymer may be in a range of about 0.2 wt % to about 20 wt %, based on the total weight of the A-containing precursor, the Q-containing precursor, and the random copolymer. In an embodiment, in the mixture, a content of the random copolymer may be about 0.5 wt % or higher and about 20 wt % or lower, based on the total weight of the A-containing precursor, the Q-containing precursor, and the random copolymer, but embodiments are not limited thereto. When the content of the random copolymer is within any of these ranges, an emission layer having a suitable thickness for providing a light-emitting device having electrical characteristics and high luminance may be provided.

In an embodiment, the mixture may be spin-coated on a substrate. When the mixture is provided by spin-coating, the spin-coating conditions may be selected from, e.g., a coating rate of about 300 rotations per minute (rpm) to about 4,000 rpm and a temperature range of about 80° C. to about 200°

C., depending on the composition of the mixture. In an embodiment, the coating rate may be controlled depending on the section. For example, the coating rate may be maintained in a range of about 300 rpm to about 700 rpm in a first section and in a range of about 2,000 rpm to about 4,000 rpm in the second section.

The mixture may be provided on a substrate by using suitable application methods.

The solvent may be selected from materials having a high solubility of the A-containing precursor and the Q-containing precursor. For example, the solvent may be dimethyl formamide, dimethyl sulfoxide, γ-butyrolactone, N-methyl-2-pyrrolidone, or a combination thereof, but embodiments are not limited thereto. In an embodiments, the solvent may be dimethyl formamide or dimethyl sulfoxide.

Then, an antisolvent may be added onto the substrate provided with the mixture for crystallization.

In an embodiment, when the mixture is provided by spin-coating, the mixture may be first spin-coated, and the antisolvent may be added thereto by dropwise adding or spraying while rotating the substrate.

The antisolvent may be selected from materials having a low solubility of the A-containing precursor and the Q-containing precursor. In an embodiment, the antisolvent may be diethyl ether, toluene, α-α-terpineol, hexyl hexyl carbitol, butyl carbitol acetate, hexyl cellosolve, butyl cellosolve acetate, or a combination thereof, but embodiments are not limited thereto. In an embodiment, the antisolvent may be diethyl ether.

Then, by heat-treating the solvent and the antisolvent may be removed.

In an embodiment, the heat-treating condition may be selected from a time range from about 15 minutes to about 2 hours and a temperature range from about 50° C. to about 200° C., depending on the composition of the mixture.

A and Q of the A-containing precursor and the Q-containing precursor may respectively be understood by referring to the descriptions of A and Q in Formula 1.

For example, the A-containing precursor may be selected from halides of A (e.g., (A)(X)), and the Q-containing precursor may be selected from halides of Q (e.g., (Q)(X)$_2$ or (Q)(X)).

Light-Emitting Device

According to an embodiment, a light-emitting device 1 may include: a first electrode 110; a second electrode 190 facing the first electrode 110; and an emission layer 150 between the first electrode 110 and the second electrode 190, wherein the emission layer 150 may include the thin film.

The structure of the light-emitting device 1 will be described in detail with reference to FIG. 1. FIG. 1 is a schematic cross-sectional view of the light-emitting device 1 according to an embodiment.

Although it is not shown in FIG. 1, a substrate may be further disposed under the first electrode 110 (opposite the emission layer 150) and/or on the second electrode 190 (opposite the emission layer 150). The substrate may be a conventional substrate used in light-emitting devices, e.g., a glass substrate or a transparent plastic substrate, each having excellent mechanical strength, thermal stability, transparency, surface smoothness, ease of handling, and water repellency.

The first electrode 110 may be an anode to which (+) voltage is applied, and the second electrode 190 may be a cathode to which (−) voltage is applied. In contrast, the first electrode 110 may be a cathode, and the second electrode 190 may be an anode. For convenience of description, the case where the first electrode 110 is an anode, and the second electrode 190 is a cathode will be described.

The first electrode 110 may be formed by depositing or sputtering, onto the substrate, a material for forming the first electrode 110. The first electrode 110 may be a reflective electrode, a semi-transmissive electrode, or a transmissive electrode. In an embodiment, to obtain a bottom emission light-emitting device, the first electrode 110 may be a semi-transmissive electrode or a transmissive electrode. In an embodiment, to obtain a top emission light-emitting device, the first electrode 110 may be a reflective electrode, and such a variation may be made. The first electrode 110 may have a single-layered structure or a multi-layered structure including a plurality of layers.

The first electrode 110 may include a material with a high work function for easy hole injection. In an embodiment, the material for forming the first electrode 110 may be indium tin oxide (ITO), indium zinc oxide (IZO), indium oxide, tin oxide (SnO$_2$), zinc oxide (ZnO), gallium oxide, or a combination thereof. In an embodiment, the material for forming the first electrode 110 may be a metal, such as magnesium (Mg), aluminum (Al), aluminum-lithium (Al—Li), calcium (Ca), magnesium-indium (Mg—In), magnesium-silver (Mg—Ag), or a combination thereof.

The second electrode 190 may be disposed to face the first electrode 110. The second electrode 190 may be a reflective electrode, a semi-transmissive electrode, or a transmissive electrode. In an embodiment, to obtain a bottom emission light-emitting device, the second electrode 190 may be a reflective electrode.

In an embodiment, to obtain a top emission light-emitting device, the second electrode 190 may be a semi-transmissive electrode or a transmissive electrode, and such a variation may be made. The second electrode 190 may have a single-layered structure or a multi-layered structure including a plurality of layers.

The second electrode 190 may include a metal, an alloy, an electrically conductive compound, or a combination thereof with a relatively low work function. In an embodiment, a material for forming the second electrode 190 may be lithium (Li), magnesium (Mg), aluminum (Al), aluminum-lithium (Al—Li), calcium (Ca), gallium (Ga), magnesium-indium (Mg—In), magnesium-silver (Mg—Ag), or a combination thereof. In an embodiment, the material for forming the second electrode 190 may include ITO, IZO, or a combination thereof.

The emission layer 150 may include the aforementioned thin film. In the emission layer 150, electrons and holes transferred by the voltage supplied by the first electrode 110 and the second electrode 190 may be combined. After the electrons and holes are combined to generate excitons, excitons transit from an excited state to a ground state to thereby generate light. The light-emitting device may have high color purity, high current efficiency, and high quantum yield by including the thin film as described herein.

The thin film may be understood by referring to the descriptions provided herein.

When providing an emission layer including a perovskite structure, a solution process may be used to improve crystallinity. The perovskite light-emitting device including the emission layer provided through the solution process may have relatively improved optical and/or electrical characteristics.

However, there are limitations in that certain conditions are satisfied when using the solution process. For example, when a precursor for forming a perovskite structure has high solubility in a solvent having high hydrophilicity, a solution including the precursor for forming a perovskite structure may be provided onto a surface having high hydrophilicity.

However, charge transport materials commercially used in light-emitting devices, charge transport polymers and/or charge transport organic semiconductors, have high hydrophobicity. Thus, when a solution including the precursor for forming the perovskite structure is provided on a charge transport layer including the charge transport materials, it is very difficult to obtain a uniform thin film.

When the charge transport layer is treated with ultraviolet (UV) rays and ozone to reduce the hydrophobicity thereof, a uniform emission layer may be obtained, however, the conjugate structure of the charge transport materials may be broken and thus degrade the electrical characteristics of the light-emitting device, thereby resulting in low external quantum yield of the light-emitting device.

In contrast, when a metal oxide having high hydrophilicity is used in the charge transport layer to improve the uniformity of the emission layer, it is very difficult to control the band gap thereof. Thus, there is a problem that characteristics of the light-emitting device including the metal oxide may be deteriorated.

However, as the light-emitting device according to an embodiment includes the foregoing random copolymer in the emission layer. One thin film characteristic can be obtained. Even when a charge transporting polymer and/or a charge transporting organic semiconductor having high hydrophobicity is used in the charge transport layer, the emission layer may have uniform thin film properties.

When the light-emitting device is a full-color light-emitting device, individual sub-pixels may include emission layers emitting different colors.

In an embodiment, the emission layer may be patterned into a first color emission layer, a second color emission layer, and a third color emission layer, according to a sub-pixel. In an embodiment, at least one emission layer among the foregoing emission layers may necessarily include the thin film. In an embodiment, the first color emission layer may be an emission layer including the thin film, and the second color emission layer and the third color emission layer may be organic emission layers each including different organic compounds. In an embodiment, the first color to the third color may be different from one another, and in an embodiment, the first color to the third color may each have different maximum emission wavelengths. The first color to the third color may be combined to be white light.

In an embodiment, the emission layer may further include a fourth color emission layer, at least one emission layer of the first color to the fourth color emission layers may be an emission layer including the thin film, and the other emission layers may be organic emission layers each including different organic compounds. Such a variation may be made. In an embodiment, the first color to the fourth color may be different from one another, and in an embodiment, the first color to the fourth color may each have different maximum emission wavelengths. The first color to the fourth color may be combined to be white light.

In an embodiment, the light-emitting device may have a structure in which at least two emission layers each emitting different colors may be in contact with or spaced apart from each other. At least one emission layer of the at least two emission layers may be an emission layer including the thin film, and the other emission layer may be organic emission layer including organic compounds. Such a variation may be made.

The thickness of the emission layer 150 may be in a range of about 10 nm to about 200 nm, for example, about 50 nm to about 100 nm. When the thickness of the emission layer 150 is within any of these ranges, improved luminescence characteristics may be obtained without a substantial increase in driving voltage.

An additional layer may be further included between the first electrode 110 and the emission layer 150 and/or between the second electrode 190 and the emission layer 150 to improve device characteristics such as luminescence efficiency by adjusting the charge carrier balance inside the device.

In an embodiment, when the first electrode 110 is an anode, and the second electrode 190 is a cathode, a hole transport region may be further included between the first electrode 110 and the emission layer 150, and an electron transport region may be further included between the second electrode 190 and the emission layer 150.

In an embodiment, when the first electrode 110 is a cathode, and the second electrode 190 is an anode, an electron transport region may be further included between the first electrode 110 and the emission layer 150, and a hole transport region may be further included between the second electrode 190 and the emission layer 150.

The hole transport region may serve to inject and/or transport holes from the first electrode 110 to the emission layer 150. In addition, the hole transport region may also compensate for an optical resonance distance depending on a wavelength of light emitted from the emission layer to improve the efficiency of an organic light-emitting device.

The hole transport region may be a single layer or a multi-layered structure including at least two layers. In an embodiment, the hole transport region may include a hole injection layer only or a hole transport layer only. In an embodiment, the hole transport region may have a structure in which a hole injection layer and a hole transport layer are sequentially stacked on the first electrode 110.

In an embodiment, the hole transport region may include a first charge transport layer (not shown). In an embodiment, the first charge transport layer may be a hole transport layer.

In an embodiment, the first charge transport layer may be in direct contact with the emission layer 150.

In an embodiment, the thickness of the first charge transport layer may be in a range of about 100 nm to about 1,000 nm. When the thickness of the first charge transport layer is within any of these ranges, luminescence characteristics may be improved without a substantial increase in driving voltage.

The first charge transport layer may include a hydrophobic material.

In an embodiment, the first charge transport layer may include a charge transporting polymer and/or a charge transporting organic semiconductor.

In an embodiment, the first charge transport layer may include, for example, 1,3-bis(9-carbazolyl)benzene (mCP), 4,4'-bis(N-carbazolyl)-1,1'-biphenyl (CBP), 3,3-bis(carbazol-9-yl)biphenyl (mCBP), 4,4',4"-tris[phenyl(m-tolyl) amino]triphenylamine (m-MTDATA), TDATA, 2-TNATA, N,N'-di(1-naphthyl)-N,N'-diphenyl-(1,1'-biphenyl)-4,4'-diamine (NPB), R—NPB, N,N'-bis(3-methylphenyl)-N,N'-diphenylbenzidine (TPD), spiro-TPD, spiro-NPB, methylated-NPB, TAPC, HMTPD, tris(4-carbazoyl-9-ylphenyl)amine (TCTA), polyaniline/dodecylbenzenesulfonic acid (PANI/DBSA), poly(3,4-ethylenedioxythiophene)/poly(4-styrene sulfonate) (PEDOT/PSS), poly(9,9-dioctyl-fluorene-co-N-(4-butylphenyl)-diphenylamine) (TFB), poly(fluorine-co-triphenylamine) (PFO-TPA), polyarylamine, poly(N-vinylcarbazole) (PVK), polypyrrole, polyaniline/camphor sulfonic acid (PANI/CSA), polyaniline/poly(4-styrenesulfonate) (PANI/PSS), or a combination thereof, but embodiments are not limited thereto:

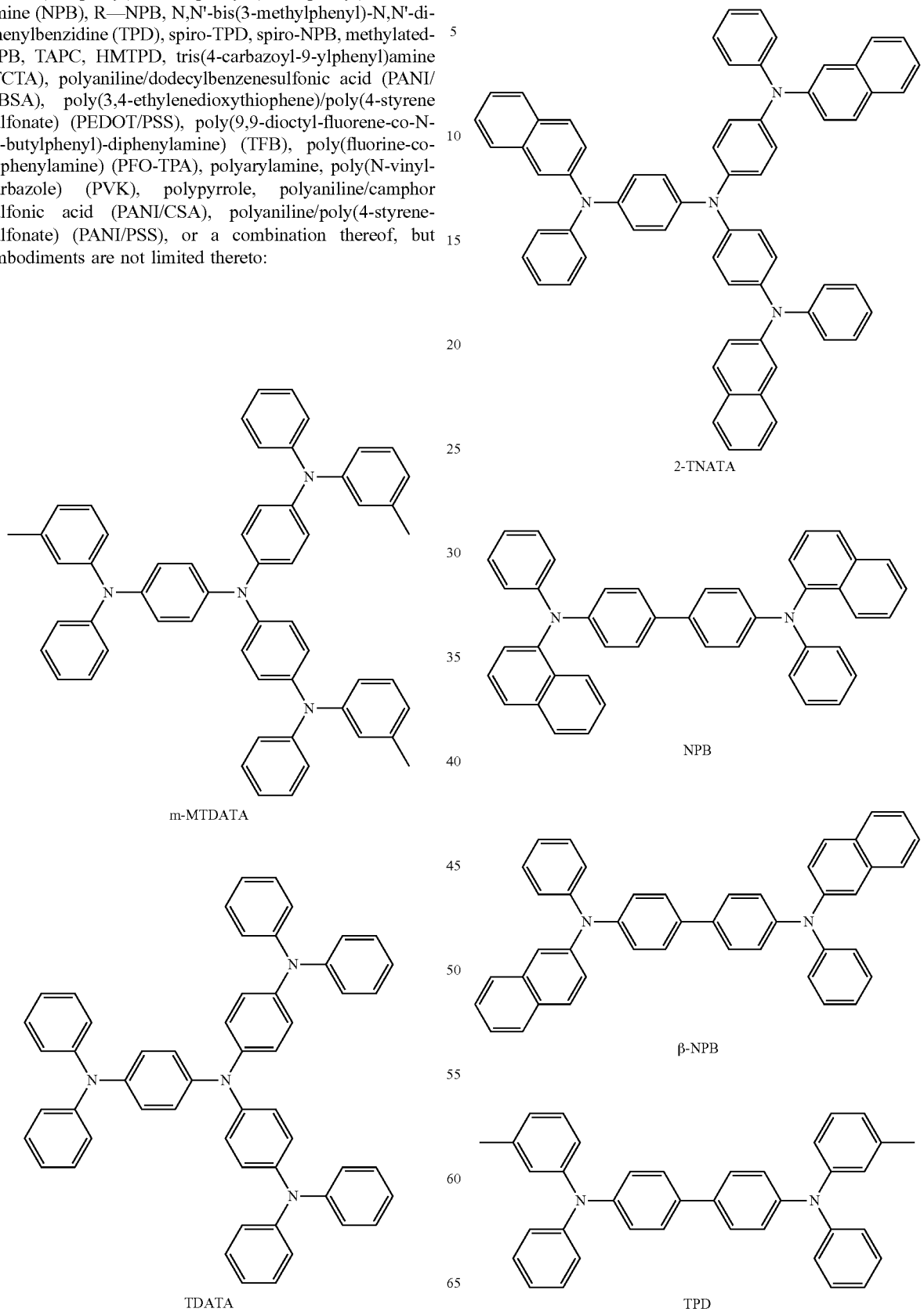

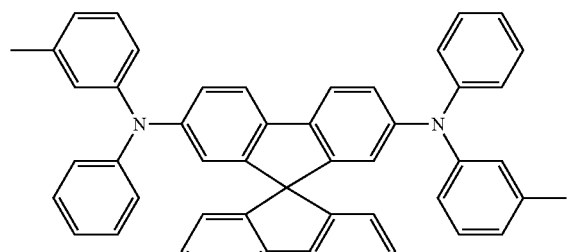

Spiro-TPD

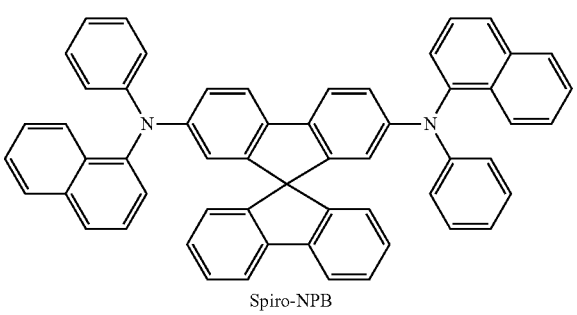

Spiro-NPB

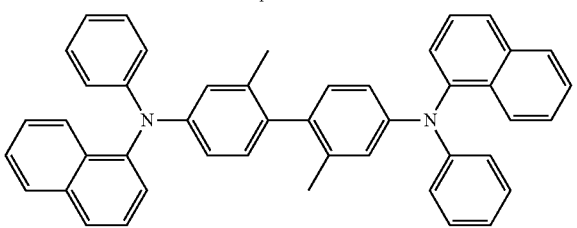

methylated NPB

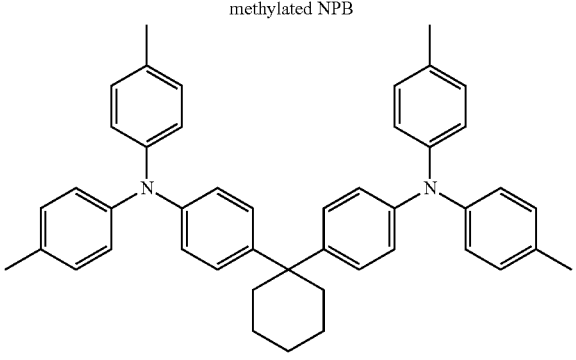

TAPC

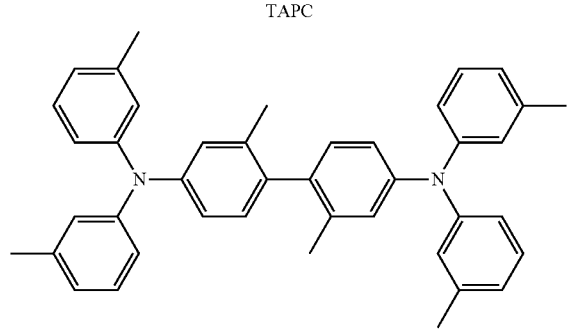

HMTPD

The thickness of the hole transport region may be determined in consideration of the wavelength of light emitted from the emission layer, the driving voltage of the light-emitting device, current efficiency, or the like. In an embodiment, the thickness of the hole transport region may be in a range of about 10 nm to about 1,000 nm, and in an embodiment, in a range of about 10 nm to about 100 nm. When the hole transport region includes the hole injection layer and the hole transport layer, the thickness of the hole injection layer may be in a range of about 10 nm to about 200 nm, and the thickness of the hole transport layer may be in a range of about 5 nm to about 100 nm.

The hole transport region may include a p-dopant as well as the aforementioned materials to improve conductive properties of the hole transport region. The p-dopant may be substantially homogeneously or non-homogeneously dispersed in the hole transport region.

The p-dopant may include a quinone derivative, a metal oxide, a compound containing a cyano group, or a combination thereof, but embodiments are not limited thereto. For example, non-limiting examples of the p-dopant include a quinone derivative, such as tetracyanoquinodimethane (TCNQ) or 2,3,5,6-tetrafluoro-tetracyano-1,4-benzoquinonedimethane (F4-TCNQ); a metal oxide, such as a tungsten oxide or a molybdenum oxide, or a compound containing a cyano group, such as Compound HAT-CN (dipyrazino[2,3-f:2',3'-h]quinoxaline-2,3,6,7,10,11-hexacarbonitrile), but embodiments are not limited thereto:

The electron transport region may serve to inject and/or transport electrons from the second electrode 190 to the emission layer 150. In addition, the electron transport region may also compensate for an optical resonance distance depending on a wavelength of light emitted from the emission layer to improve the efficiency of an organic light-emitting device.

The electron transport region may include an electron injection layer, an electron transport layer, a charge control layer, or a combination thereof. The electron transport region may be a single layer or a multi-layered structure including at least two layers. In an embodiment, the electron transport region may include an electron injection layer only or an electron transport layer only. In an embodiment, the hole transport region may include a structure of electron transport layer/electron injection layer or charge control layer/electron transport layer/electron injection layer, which are sequentially stacked on the emission layer 150.

The electron transport region may include, for example, Alq$_3$, bathocuproine (BCP), 4,7-diphenyl-1,10-phenanthroline (Bphen), bis(2-methyl-8-quinolinolato-N1,O8)-(1,1'-biphenyl-4-olato)aluminum (Balq), 3-(biphenyl-4-yl)-5-(4-tert-butylphenyl)-4-phenyl-4H-1,2,4-triazole (TAZ), 4-(naphthalen-1-yl)-3,5-diphenyl-4H-1,2,4-triazole (NTAZ), bis(10-hydroxybenzo[h]quinolinato)beryllium (Bebq$_2$), B3PYMPM, TPBI, 3TPYMB, BmPyPB, TmPyPB, BSFM, PO-T2T, PO15, (8-(4-(4,6-di(naphthalen-2-yl)-1,3,5-triazin-2-yl)phenyl)quinolone) (ET204), or a combination thereof, but embodiments are not limited thereto. In an embodiment, the electron transport layer and/or the charge control layer may include at least one of the foregoing compounds, but embodiments are not limited thereto.

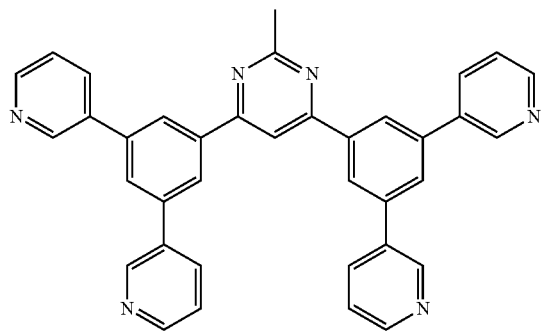
B3PYMPM
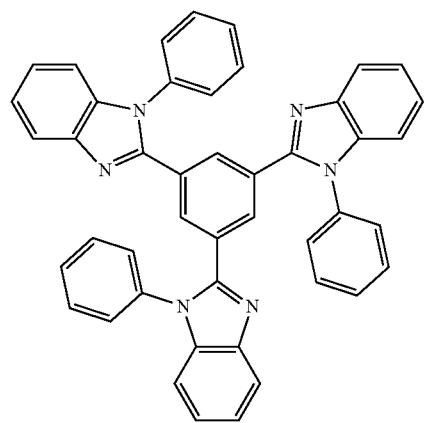
TPBI
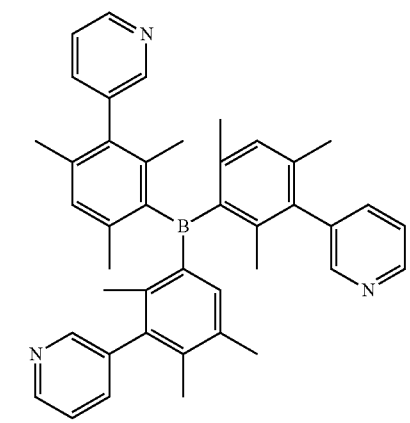
3TPYMB
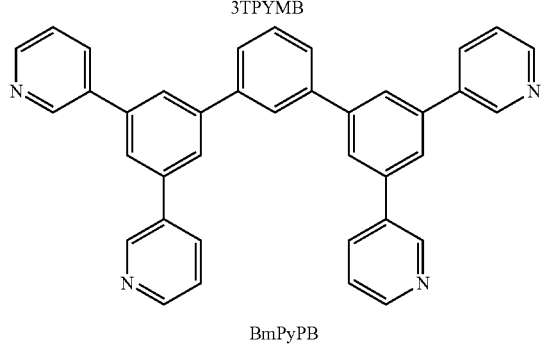
BmPyPB
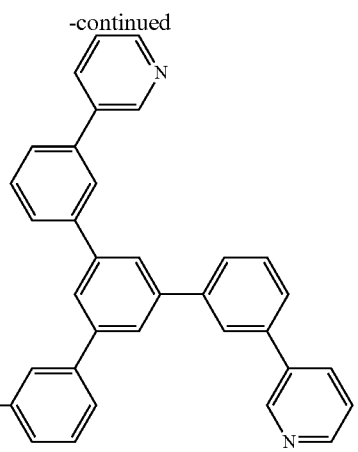
TmPyPB
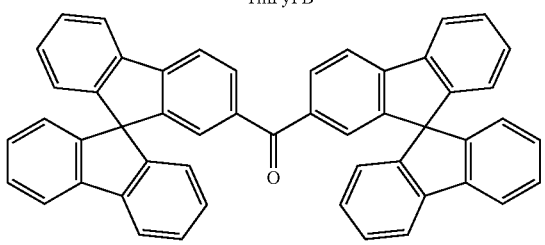
BSFM
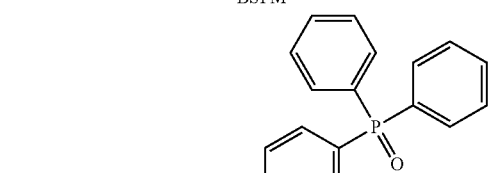
PO-T2T
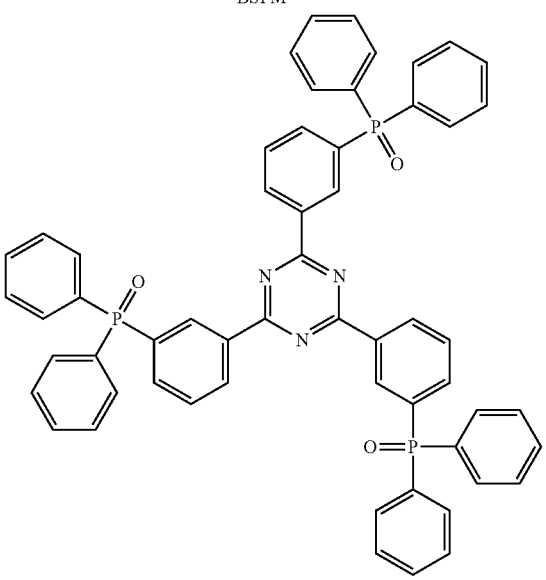
PO15
In an embodiment, the electron injection layer may consist essentially of an alkali metal, an alkaline earth metal, a rare earth metal, an alkali metal compound, an alkaline earth metal compound, a rare earth metal compound, an alkali metal complex, an alkaline earth metal complex, a rare earth metal complex, or a combination thereof. In an embodiment, the electron injection layer may further include organic materials described herein, but embodiments are not limited thereto. In an embodiment, the electron injection layer may consist of an alkali metal, an alkaline earth metal, a rare earth metal, an alkali metal compound, an alkaline earth metal compound, a rare earth metal compound, an alkali metal complex, an alkaline earth metal complex, a rare earth metal complex, or a combination thereof.

In an embodiment, the electron injection layer may further include LiF, NaF, CsF, KF, $Li_2O$, $Cs_2O$, $K_2O$, BaO, SrO, CaO, 8-quinolinolato lithium (LiQ), or any combination thereof. In an embodiment, the electron injection layer may further include the foregoing organic compound, but embodiments are not limited thereto.

The thickness of the electron transport region may be determined in consideration of the wavelength of light emitted from the emission layer, the driving voltage of the light-emitting device, current efficiency, or the like. In an embodiment, the thickness of the electron transport region may be in a range of about 1 nm to about 1,000 nm, and in an embodiment, in a range of about 1 nm to about 200 nm. When the electron transport region includes the electron injection layer and the electron transport layer, the thickness of the electron injection layer may be in a range of about 1 nm to about 50 nm, and the thickness of the electron transport layer may be in a range of about 5 nm to about 100 nm.

The charge control layer may be included to adjust the charge injection balance at an interface between the layer including an organic compound (e.g., a hole transport layer, an electron transport layer, or the like) and the layer including an inorganic compound (e.g., an emission layer). The charge control layer may include a polymeric compound, e.g., poly(methyl methacrylate) (PMMA), polyimide (PI), poly vinyl alcohol (PVA), or a combination or copolymer thereof, but embodiments are not limited thereto. By including the electron control layer, the charge injection balance of the light-emitting device may be improved, thereby increasing the external quantum yield. In addition, as the electron control layer is directly adjacent to the emission layer, the emission layer may be flat, and the driving voltage of the light-emitting device may be lowered.

According to an embodiment, the light-emitting device may include a hole transport region between the first electrode and/or the emission layer and an electron transport region between the emission layer and the second electrode.

In an embodiment, the light-emitting device may include a charge control layer between the first electrode and the emission layer and/or between the emission layer and the second electrode.

Each layer in the light-emitting device 1 may be formed by various methods, such as vacuum deposition, spin coating, casting, Langmuir-Blodgett (LB) deposition, or the like.

When a hole injection layer is formed by vacuum-deposition, for example, the vacuum deposition may be performed at a temperature in a range of about 100° C. to about 500° C., at a vacuum degree in a range of about 10-8 torr to about 10-3 torr, and at a rate in a range of about 0.01 Angstroms per second (Å/sec) to about 100 Å/sec, though the conditions may vary depending on a compound used as a hole injection material and a structure and thermal properties of a desired hole injection layer, but embodiments are not limited thereto.

When a hole injection layer is formed by spin coating, the spin coating may be performed at a rate in a range of about 2,000 revolutions per minute (rpm) to about 5,000 rpm and at a temperature in a range of about 80° C. to 200° C. to facilitate removal of a solvent after the spin coating, though the conditions may vary depending on a compound used as a hole injection material and a structure and thermal properties of a desired hole injection layer, but embodiments are not limited thereto.

The light-emitting device has been described with reference to FIG. 1, but is not limited thereto.

A thin film according to an embodiment, a method of manufacturing the thin film, and a light-emitting device including the thin film will be described in more detail with reference to Synthesis Examples and Examples; however, embodiments are not limited thereto. The wording "Q was used instead of A" used in describing Synthesis Examples means that an identical molar equivalent of Q was used in place of A.

EXAMPLES

Synthesis Example: Manufacture of Thin Film

A first mixture including the A-containing precursor, the Q-containing precursor, and a solvent were prepared as in Table 1 at a temperature of 80° C. A random copolymer in the amount shown in Table 1 was added to the first mixture to prepare a second mixture.

Mixtures 1-1 to 1-5 and 2-1 to 2-5, Comparative Mixtures 1-1 and 2-1 Reference Mixtures 1 to 3, and Comparative Mixtures C to E were each spin-coated on a substrate at a rate of 500 rotations per minute (rpm) for 10 seconds and then at a rate of 2,000 to 4,000 rpm for 30 seconds. Here, from the time of 25 seconds after starting the spin-coating, diethyl ether was added dropwise thereto at a rate of 2 milliliters (mL) per second for 0.5 seconds. This mixture was heat-treated at 60° C. to 120° C. for 10 minutes to prepare substrates of Thin Films 1-1 to 1-5 and 2-1 to 2-5 and Comparative Thin Films 1-1 and 2-1, each having a thickness of 200 nm to 400 nm and the final composition as shown in Table 2.

Comparative Mixture A was spin-coated on a substrate for 10 seconds at 500 rpm and then spin-coated for 30 seconds at 2,000 rpm to 4,000 rpm. Here, from the time of 25 seconds after starting the spin-coating, diethyl ether was added dropwise thereto at a rate of 2 mL per second for 0.5 seconds. The resultant was heat-treated at a temperature of 60° C. to 120° C. for 10 minutes. However, a thin film was not formed using Comparative Mixture A. In addition, an experiment was performed to form a thin film using Comparative Mixture B in the same manner as in the method of forming a thin film using Comparative Mixture A, but a thin film was not formed using Comparative Mixture B.

Comparative Mixture B was spin-coated on a substrate for 10 seconds at 500 rpm and then spin-coated for 30 seconds at 2,000 rpm to 4,000 rpm. This mixture was heat-treated at 60° C. to 120° C. for 10 minutes to prepare a substrate of Comparative Thin Film B-2 having a thickness of 200 nm to 400 nm and the final composition as shown in Table 2.

In Table 1, "P2VP-r-PS" represents a poly(2-vinyl pyridine)-polystyrene random copolymer having a weight average molecular weight (Mw) of 220,000 grams per mole (g/mol), "PS" represents a polystyrene homopolymer having a Mw of 192,000 g/mol, "P2VP" represents a poly(2-vinyl pyridine)homopolymer having a Mw of 152,000 g/mol, and "P2VP-b-PS" represents a poly(2-vinyl pyridine)-polystyrene block copolymer having a Mw of 202,000 g/mol.

TABLE 1

| Second Mixture No. | A-containing precursor | Q-containing precursor | Content Molar ratio* | Solvent | Concentration of precursor (Molar conc.) | Random copolymer | Content of random copolymer (wt %)** |
|---|---|---|---|---|---|---|---|
| Comparative Mixture 1-1 | CsI | CuI | 3:2 | DMF | 1.25M | — | 0 |
| Mixture 1-1 | CsI | CuI | 3:2 | DMF | 1.25M | P2VP-r-PS | 0.5 |
| Mixture 1-2 | CsI | CuI | 3:2 | DMF | 1.25M | P2VP-r-PS | 1 |
| Mixture 1-3 | CsI | CuI | 3:2 | DMF | 1.25M | P2VP-r-PS | 2 |
| Mixture 1-4 | CsI | CuI | 3:2 | DMF | 1.25M | P2VP-r-PS | 4 |
| Mixture 1-5 | CsI | CuI | 3:2 | DMF | 1.25M | P2VP-r-PS | 8 |
| Comparative Mixture 2-1 | CsBr | $PbBr_2$ | 1:1.2 | DMSO | 0.3M | — | 0 |
| Mixture 2-1 | CsBr | $PbBr_2$ | 1:1.2 | DMSO | 0.3M | P2VP-r-PS | 1 |
| Mixture 2-2 | CsBr | $PbBr_2$ | 1:1.2 | DMSO | 0.3M | P2VP-r-PS | 2 |
| Mixture 2-3 | CsBr | $PbBr_2$ | 1:1.2 | DMSO | 0.3M | P2VP-r-PS | 4 |
| Mixture 2-4 | CsBr | $PbBr_2$ | 1:1.2 | DMSO | 0.3M | P2VP-r-PS | 8 |
| Mixture 2-5 | CsBr | $PbBr_2$ | 1:1.2 | DMSO | 0.3M | P2VP-r-PS | 16 |
| Comparative Mixture A | CsI | CuI | 3:2 | DMF | 1.25M | PS | 2 |
| Comparative Mixture B | CsI | CuI | 3:2 | DMF | 1.25M | P2VP | 2 |
| Reference Mixture 1 | CsBr | $PbBr_2$ | 1:1.2 | DMSO | 0.2M | — | 0 |
| Reference Mixture 2 | CsBr | $PbBr_2$ | 1:1.2 | DMSO | 0.3M | — | 0 |
| Reference Mixture 3 | CsBr | $PbBr_2$ | 1:1.2 | DMSO | 0.5M | — | 0 |
| Comparative Mixture C | CsBr | $PbBr_2$ | 1:1.2 | DMSO | 0.2M | P2VP-b-PS | 2 |
| Comparative Mixture D | CsBr | $PbBr_2$ | 1:1.2 | DMSO | 0.3M | P2VP-b-PS | 2 |
| Comparative Mixture E | CsBr | $PbBr_2$ | 1:1.2 | DMSO | 0.5M | P2VP-b-PS | 2 |

*Molar ratio of A-containing precursor to Q-containing precursor
**Based on total weight of A-containing precursor, Q-containing precursor, and random copolymer

TABLE 2

| Second Mixture No. | Final product | Composition of final product |
|---|---|---|
| Comparative Mixture 1-1 | Comparative Thin Film 1-1 | $Cs_3Cu_2I_5$ |
| Mixture 1-1 | Thin Film 1-1 | $Cs_3Cu_2I_5$ + P2VP-r-PS |
| Mixture 1-2 | Thin Film 1-2 | $Cs_3Cu_2I_5$ + P2VP-r-PS |
| Mixture 1-3 | Thin Film 1-3 | $Cs_3Cu_2I_5$ + P2VP-r-PS |
| Mixture 1-4 | Thin Film 1-4 | $Cs_3Cu_2I_5$ + P2VP-r-PS |
| Mixture 1-5 | Thin Film 1-5 | $Cs_3Cu_2I_5$ + P2VP-r-PS |
| Comparative Mixture 2-1 | Comparative Thin Film 2-1 | $CsPbBr_3$ |
| Mixture 2-1 | Thin Film 2-1 | $CsPbBr_3$ + P2VP-r-PS |
| Mixture 2-2 | Thin Film 2-2 | $CsPbBr_3$ + P2VP-r-PS |
| Mixture 2-3 | Thin Film 2-3 | $CsPbBr_3$ + P2VP-r-PS |
| Mixture 2-4 | Thin Film 2-4 | $CsPbBr_3$ + P2VP-r-PS |
| Mixture 2-5 | Thin Film 2-5 | $CsPbBr_3$ + P2VP-r-PS |
| Comparative Mixture A | Thin film was not formed | Thin film was not formed |
| Comparative Mixture B | Thin film was not formed | Thin film was not formed |
| Comparative Mixture B | Thin Film B-2 | $Cs_3Cu_2I_5$ + P2VP |
| Reference Mixture 1 | Reference Thin Film 1 | $CsPbBr_3$ |
| Reference Mixture 2 | Reference Thin Film 2 | $CsPbBr_3$ |
| Reference Mixture 3 | Reference Thin Film 3 | $CsPbBr_3$ |
| Comparative Mixture C | Comparative Thin Film C | $CsPbBr_3$ + P2VP-b-PS |
| Comparative Mixture D | Comparative Thin Film D | $CsPbBr_3$ + P2VP-b-P |
| Comparative Mixture E | Comparative Thin Film E | $CsPbBr_3$ + P2VP-b-P |

Experimental Example 1: Measurement of PL Spectrum, UV Spectrum, and Photoluminescent Quantum Yield (PLQY)

Figure 2:
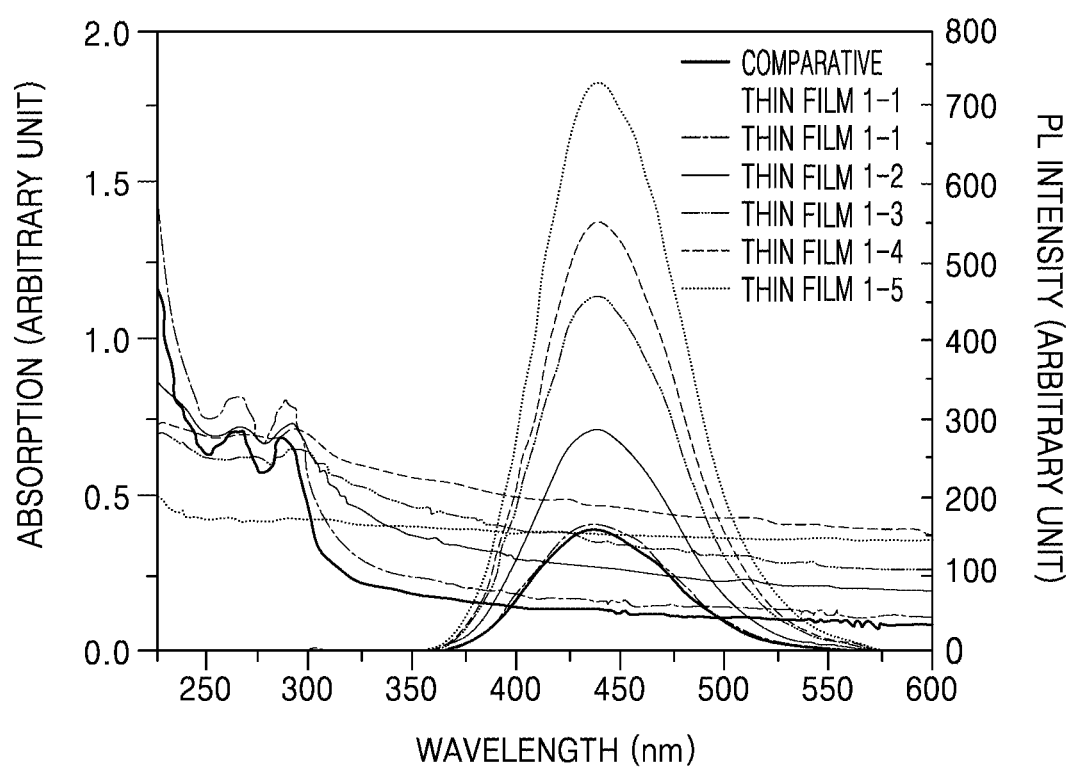
FIG. 2 is a graph of wavelength (nanometers, nm) versus absorption (arbitrary unit), showing photoluminescence (PL) spectra and ultraviolet (UV) spectra of Comparative Thin Film 1-1 and Thin Films 1-1 to 1-5.
Figure 3:
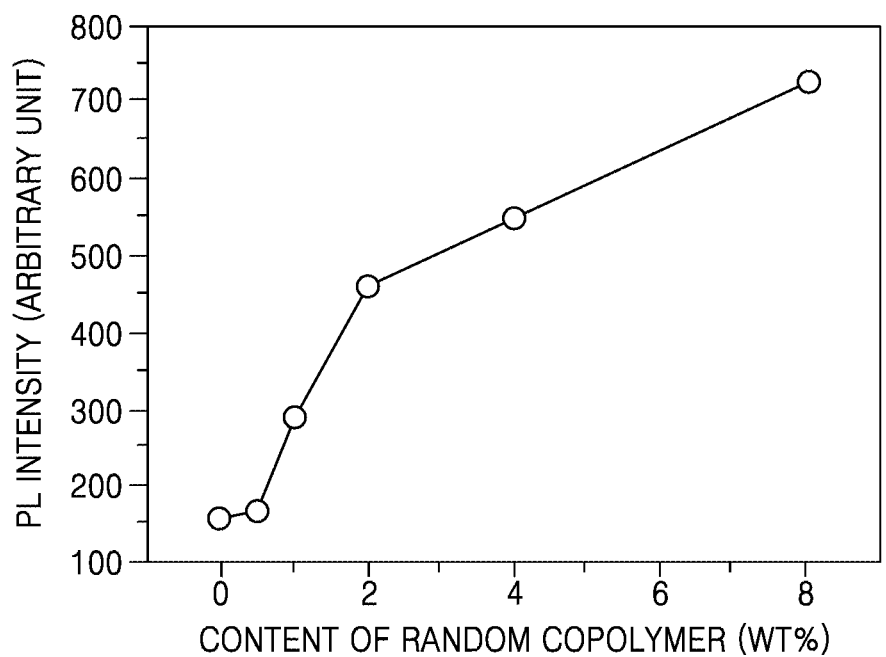
FIG. 3 is a graph of content of random copolymer (percent by weight, wt %) versus PL intensity (arbitrary unit), showing PL intensity of Comparative Thin Film 1-1 and Thin Films 1-1 to 1-5.

The PL spectra, UV spectra, and PLQY of Comparative Thin Film 1-1 and Thin Films 1-1 to 1-5 were measured and shown in FIGS. 2 and 3 and Table 3. The PL spectra and PLQY were measured by excitation under nitrogen atmosphere with excitation light having a wavelength of 290 nm to 340 nm for each thin film.

Figure 4:
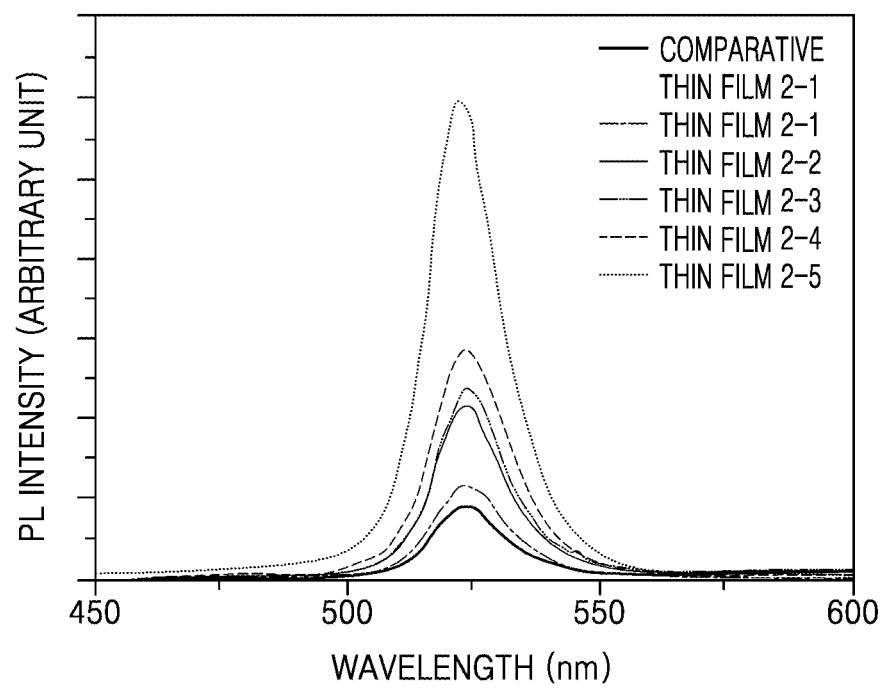
FIG. 4 is a graph of wavelength (nm) versus PL intensity (arbitrary unit), showing PL spectra of Comparative Thin Film 2-1 and Thin Films 2-1 to 2-5.

The PL spectra of Comparative Thin Film 2-1 and Thin Films 2-1 to 2-5 were measured and shown in FIG. 4. The PL spectra were measured by excitation under nitrogen atmosphere with excitation light having a wavelength of 290 nm to 340 nm for each thin film.

Figure 5:
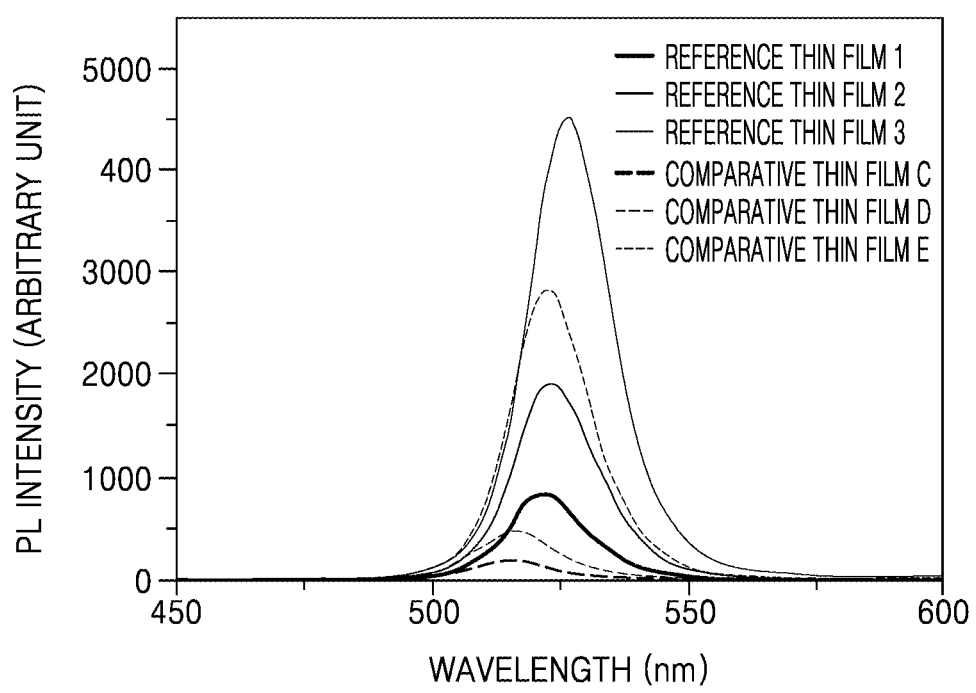
FIG. 5 is a graph of wavelength (nm) versus PL intensity (arbitrary unit), showing PL spectra of Reference Thin Films 1 to 3 and Comparative Thin Films C, D, and E.

The PL spectra of Reference Thin Films 1 to 3 and Comparative Thin Films C to E were measured and shown in FIG. 5. The PL spectra were measured by excitation under nitrogen atmosphere with excitation light having a wavelength of 290 nm to 340 nm for each thin film.

In Table 3, the changes in PL intensity and PLQY were measured based on Comparative Thin Film 1-1

TABLE 3

| Thin Film No. | PL intensity (arbitrary unit) | PL intensity change (%) | PLQY (%) |
|---|---|---|---|
| Comparative Thin Film 1-1 | 156 | — | 44.8 |
| Thin Film 1-1 | 164 | Δ 5.6 | 45.8 |
| Thin Film 1-2 | 285 | Δ 82.7 | 49.9 |
| Thin Film 1-3 | 457 | Δ 192.8 | 47.3 |

TABLE 3-continued

| Thin Film No. | PL intensity (arbitrary unit) | PL intensity change (%) | PLQY (%) |
|---|---|---|---|
| Thin Film 1-4 | 548 | Δ 251.6 | 40.6 |
| Thin Film 1-5 | 726 | Δ 365.2 | 33.9 |

As shown in FIGS. 2 and 3 and Table 3, Thin Films 1-1 to 1-5 were found to have improved PL intensity, as compared with Comparative Thin Film 1-1.

As shown in FIG. 4, Thin Films 2-1 to 2-5 were found to have improved PL intensity, as compared with Comparative Thin Film 2-1.

In addition, as shown in FIG. 5, when a block copolymer is used, the PL intensity may be reduced, as compared with a case where a block copolymer is not used.

Example

A light-emitting device having a structure of ITO (anode)/PEDOT:PSS (10 nm, hole injection layer)/TFB (500 nm, hole transport layer)/Thin Film 2-3 (100 nm, emission layer)/ET204 (40 nm, electron transport layer)/LiQ (1 nm, electron injection layer)/Al (100 nm, cathode) was manufactured.

Comparative Example

A light-emitting device having a structure of ITO (anode)/PEDOT:PSS (10 nm, hole injection layer)/Comparative Thin Film 2-1 (100 nm, emission layer)/ET204 (40 nm, electron transport layer)/LiQ (1 nm, electron injection layer)/Al (1'00 nm, cathode) was manufactured.

Experimental Example 2: Evaluation of Light-Emitting Device

Figure 6:
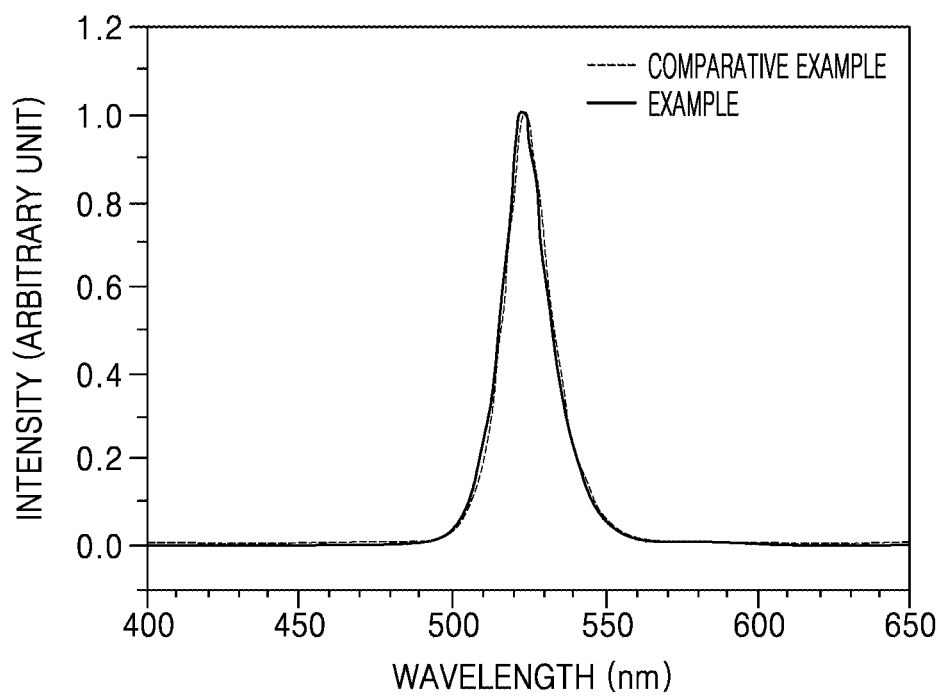
FIG. 6 is a graph of wavelength (nm) versus normalized electroluminescence (EL) intensity, showing EL spectra of an Example and a Comparative Example.

The driving voltage, current density, current efficiency, power efficiency, luminance, color-coordinate, and EL spectra of the Example and the Comparative Example were measured and shown in Table 4 and FIG. 6.

TABLE 4

| | | | | Max point of external quantum yield (EQE) | | | | | |
|---|---|---|---|---|---|---|---|---|---|
| | Vth | V at 1 nit | Driving voltage (V) | Current density (mA/cm²) | Current efficiency (cd/A) | Power efficiency (lm/W) | Luminance (Cd/m²) | X | Y |
| Comparative Example | — | 3.8 | 4.6 | 222 | 0.0027 | 0.0018 | 5.887 | 0.1416 | 0.7695 |
| Example | — | 3.2 | 4.4 | 173 | 0.0562 | 0.0401 | 71.39 | 0.1315 | 0.793 |

As shown in Table 4, it was found that the light-emitting device of the Example had improved current efficiency, power efficiency, and luminance, as compared with the light-emitting device of the Comparative Example.

As apparent from the foregoing description, the thin film has improved luminescence characteristics, and thus, a light-emitting device employing the thin film may have improved luminance and/or efficiency.

It should be understood that embodiments described herein should be considered in a descriptive sense only and not for purposes of limitation. Descriptions of features, aspects, or advantages within each embodiment should be considered as available for other similar features, aspects, or advantages in other embodiments. While one or more embodiments have been described with reference to the figures, it will be understood by those of ordinary skill in the art that various changes in form and details may be made therein without departing from the spirit and scope as defined by the following claims.

What is claimed is:

1. A thin film comprising a luminescent compound represented by Formula 1 and a random copolymer, wherein the random copolymer comprises a first repeating unit comprising at least one aromatic ring and a second repeating unit comprising a heteroatom comprising at least one lone pair of electrons, the second repeating unit comprising a benzoxazole group, a pyridine group, or a combination thereof, $$[A]_n[Q]_m[X]_l \quad \text{Formula 1}$$

wherein, in Formula 1,
A is a monovalent organic cation, a monovalent inorganic cation, or a combination thereof,
Q is a divalent metal cation, a divalent metalloid cation, or a combination thereof,
X is at least one monovalent halogen ion,
n is an integer from 1 to 3,
m is an integer from 1 to 2, and
l is an integer from 1 to 5,
wherein a weight of the luminescent compound is about 50 percent by weight to less than 100 percent by weight, based on the total weight of the thin film.

2. The thin film of claim 1, wherein the thin film consists essentially of the luminescent compound and the random copolymer.

3. The thin film of claim 1, wherein the at least one aromatic ring consists of carbon atoms and hydrogen atoms.

4. The thin film of claim 1, wherein the at least one aromatic ring comprises 6 to 30 carbon atoms.

5. The thin film of claim 1, wherein the at least one aromatic ring is a benzene group, a naphthalene group, a phenanthrene group, an anthracene group, a chrysene group, a pyrene group, a triphenylene group, or a combination thereof.

6. The thin film of claim 1, wherein the second repeating unit comprises a pyridine group.

7. The thin film of claim 1, wherein A is an ammonium ion, an alkylammonium ion, an arylammonium ion, an arylalkylammonium ion, a formamidinium ion, an alkylamidinium ion, an arylamidinium ion, an aryl alkylamidinium ion, an alkali metal ion, or a combination thereof, Q is $Pb^{2+}$, $Sn^{2+}$, $Bi^{2+}$, $Sb^{2+}$, $Cu^{2+}$, $Ag^{2+}$, $Au^{2+}$, $La^{2+}$, $Ce^{2+}$, $Pr^{2+}$, $Nd^{2+}$, $Pm^{2+}$, $Sm^{2+}$, $Eu^{2+}$, $Gd^{2+}$, $Tb^{2+}$, $Dy^{2+}$, $Ho^{2+}$, $Er^{2+}$, $Tm^{2+}$, $Yb^{2+}$, $Lu^{2+}$, $Be^{2+}$, $Mg^{2+}$, $Ca^{2+}$, $Sr^{2+}$, $Ba^{2+}$, $Ra^{2+}$, or a combination thereof, and X is $Cl^-$, $Br^-$, $I^-$, or a combination thereof.

8. The thin film of claim 1, wherein A is a methylammonium ion, a formamidinium ion, Cs+, or a combination thereof, Q is $Pb^{2+}$, $Cu^{2+}$, $Ag^{2+}$, $Au^{2+}$, or a combination thereof, and X is $Br^-$, $I^-$, or a combination thereof.

9. The thin film of claim 1, wherein the luminescent compound is represented by Formula 1-1, Formula 1-2, or a combination thereof:

$$[A]_{n1}[Q]_{m1}[X]_{l1} \quad \text{Formula 1-1}$$

$$[A]_{n2}[Q]_{m2}[X]_{l2} \quad \text{Formula 1-2}$$

wherein, in Formulae 1-1 and 1-2,
- A is a monovalent organic cation, a monovalent inorganic cation, or a combination thereof,
- Q is a divalent metal cation, a divalent metalloid cation, or a combination thereof,
- X is at least one monovalent halogen ion
- n1 is 1, m1 is 1, l1 is 3,
- n2 is 3, m2 is 2, and l2 is 5.

10. The thin film of claim 9, wherein A is a methylammonium ion, a formamidinium ion, Cs+, or a combination thereof, Q is $Pb^{2+}$, $Cu^{2+}$, $Ag^{2+}$, $Au^{2+}$, or a combination thereof, and X is $Br^-$, $I^-$, or a combination thereof.

11. The thin film of claim 1, wherein the luminescent compound is methylammonium —$PbBr_3$, methylammonium —$PbI_3$, formamidinium —$PbBr_3$, formamidinium —$PbI_3$, $CsPbBr_3$, $CsPbI_3$, trimethylammonium —$Cu_2Br_5$, trimethylammonium —$Cu_2I_5$, triformamidinium —$Cu_2Br_5$, triformamidinium —$Cu_2I_5$, $Cs_3Cu_2Br_5$, $Cs_3Cu_2I_5$, or a combination thereof.

12. A thin film comprising a luminescent compound represented by Formula 1 and a random copolymer, wherein the random copolymer comprises a first repeating unit comprising at least one aromatic ring and a second repeating unit comprising a heteroatom comprising at least one lone pair of electrons, the second repeating unit comprising a benzoxazole group, a pyridine group, or a combination thereof, $$[A]_n[Q]_m[X]_l \quad \text{Formula 1}$$

wherein, in Formula 1,
- A is a monovalent organic cation, a monovalent inorganic cation, or a combination thereof,
- Q is a divalent metal cation, a divalent metalloid cation, or a combination thereof,
- X is at least one monovalent halogen ion,
- n is an integer from 1 to 3,
- m is an integer from 1 to 2, and
- l is an integer from 1 to 5,
- wherein the thin film comprises a first area and a second area, wherein a ratio of a weight ratio of the luminescent compound to the random copolymer in the first area to a weight ratio of the luminescent compound to the random copolymer in the second area is in a range of about 0.9:1.0 to about 1.0:0.9.

13. The thin film of claim 12, wherein a weight of the luminescent compound is about 50 percent by weight to less than 100 percent by weight, based on the total weight of the thin film.

14. A thin film comprising a luminescent compound represented by Formula 1 and a random copolymer, wherein the random copolymer comprises a first repeating unit comprising at least one aromatic ring and a second repeating unit comprising a heteroatom comprising at least one lone pair of electrons, the second repeating unit comprising a benzoxazole group, a pyridine group, or a combination thereof, $$[A]_n[Q]_m[X]_l \quad \text{Formula 1}$$

wherein, in Formula 1,
- A is a monovalent organic cation, a monovalent inorganic cation, or a combination thereof,
- Q is a divalent metal cation, a divalent metalloid cation, or a combination thereof,
- X is at least one monovalent halogen ion,
- n is an integer from 1 to 3,
- m is an integer from 1 to 2, and
- l is an integer from 1 to 5,
- wherein the thin film comprises a first surface and a second surface facing the first surface, wherein a ratio of a weight ratio of the luminescent compound to the random copolymer in the first surface to a weight ratio of the luminescent compound to the random copolymer in the second surface is in a range of about 0.9:1.0 to about 1.0:0.9.

15. A light-emitting device comprising:
a first electrode;
a second electrode facing the first electrode;
an emission layer between the first electrode and the second electrode,
wherein the emission layer comprises the thin film of claim 1.

16. The light-emitting device of claim 15, wherein the light-emitting device comprises a hole transport region between the first electrode and the emission layer and/or an electron transport region between the emission layer and the second electrode.

17. The light-emitting device of claim 15, further comprising a first charge transport layer between the first electrode and the emission layer, wherein the first charge transport layer comprises a hydrophobic material.

18. The light-emitting device of claim 17, wherein the first charge transport layer is in direct contact with the emission layer.

* * * * *